(12) United States Patent
Lui et al.

(10) Patent No.: US 6,647,994 B1
(45) Date of Patent: Nov. 18, 2003

(54) METHOD OF RESIST STRIPPING OVER LOW-K DIELECTRIC MATERIAL

(75) Inventors: Ming-Huei Lui, Sen-Kan (TW); Mei-Hui Sung, Sen-Kan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/038,709

(22) Filed: Jan. 2, 2002

(51) Int. Cl.$^7$ .......................... H01L 21/302; B08B 6/00
(52) U.S. Cl. .................. 134/1.2; 438/725; 438/714; 438/710; 438/737; 438/726; 438/727; 216/63; 216/69; 216/71
(58) Field of Search .................. 134/1.2; 438/725, 438/714, 710, 737, 726, 727; 216/63, 69, 71, 49

(56) References Cited

U.S. PATENT DOCUMENTS

| | | | |
|---|---|---|---|
| 5,057,187 A | 10/1991 | Shinagawa et al. ......... 156/643 |
| 5,262,279 A | 11/1993 | Tsang et al. ................. 430/311 |
| 6,105,588 A | 8/2000 | Li et al. ....................... 134/1.1 |
| 6,413,877 B1 * | 7/2002 | Annapragada ............... 438/723 |
| 2002/0111041 A1 * | 8/2002 | Annapragada et al. ...... 438/784 |
| 2002/0119664 A1 * | 8/2002 | Annapragada et al. ...... 438/700 |

FOREIGN PATENT DOCUMENTS

| JP | 59-086224 | * | 5/1984 |
|---|---|---|---|
| JP | 06-132259 | * | 5/1994 |

* cited by examiner

Primary Examiner—George Goudreau
(74) Attorney, Agent, or Firm—George O. Saile; Stephen B. Ackerman

(57) ABSTRACT

An improved and new process for photoresist stripping for use during fabrication of semiconductor integrated circuits, which use porous low-k dielectric materials, such as OSG or HSQ, as the interlevel and intra-level insulating layers, has been developed. Photoresist stripping in microwave or rf generated plasmas in gaseous mixtures of $NH_3$ and CO takes place without attack or damage to underlying layers of OSG or HSQ. Optimum results are obtained when the ratio of CO to $NH_3$ is between about 0.8 and 1.2.

28 Claims, 2 Drawing Sheets

METHOD OF RESIST STRIPPING OVER LOW-K DIELECTRIC MATERIAL

BACKGROUND OF THE INVENTION (1) Field of the Invention

This invention relates to a method of fabrication used for semiconductor integrated circuit devices, and more specifically to a method of resist stripping from a substrate containing low-k dielectric material.

(2) Description of Related Art

In the fabrication of semiconductor integrated circuits device element geometries have shrunk to and below 0.5 microns. At the same time the demands upon the interlevel dielectric layers and the conductive materials used for device interconnections have become more stringent. The interlevel dielectric layers must fill gaps with higher aspect ratios and must provide lower dielectric constants in order to reduce both interlevel and intra-level capacitance. Capacitance markedly increases when the spacing between conductive elements decreases below 0.5 microns and it becomes imperative that low dielectric constant material be used as both the interlevel and intra-level insulating material. Circuit speed is a function of the RC constant of the integrated circuit devices, where R is the resistance of the conducting portions of the integrated circuit and C is the capacitance, both interlevel and intra-level, of the integrated circuit structure. Therefore, it is desirable that the RC constant be low, so a high conductivity material, such as copper is preferred for the interconnection elements of the integrated circuit and a low dielectric constant material, such as OSG (Organic Silicate Glass) or HSQ (hydrogen silsesquioxane) is preferred as the interlevel and intra-level insulating layers. One factor in achieving a low dielectric constant in OSG is the more porous structure of OSG, as generated by the organic doping during deposition or formation of the OSG layers. It is known that porous dielectrics, and particularly OSG dielectric layers, are subject to attack and damage by photoresist stripping processes in plasmas containing $O_2$. When vertical structures, etched in OSG, are subjected to $O_2$ containing plasmas, as would be the case when stripping a photoresist mask from the top surface of the OSG structure, the $O_2$ containing plasma attacks the sidewalls of the OSG structure and causes a loss of vertical profile in the OSG structure. This loss of vertical profile (called bowing) in the etched OSG layer results in the loss of OSG material and produces a structure that is more difficult to fill with a subsequently deposited layer, such as a conductive layer comprising copper or tungsten. Filling of etched trenches and etched features in dielectric layers by deposition of a conducting layer over the etched trenches and features, followed by removal of unwanted conductive material from the top surface of the dielectric layer by CMP (Chemical Mechanical Polishing) is known as the Damascene process.

Therefore, an important challenge in using OSG as a low dielectric constant insulator in multilevel integrated circuit structures is to develop a photoresist stripping process which does not attack or damage an underlying OSG layer or profiles etched in the OSG layer.

Numerous processes have been developed for stripping photoresist. U.S. Pat. No. 5,262,279 entitled "Dry Process For Stripping Photoresist From A Polyimide Surface" granted Nov. 16, 1993 to Chi-Hwa Tsang et al. describes a dry process for stripping photoresist from a polyimide surface formed on a semiconductor substrate. The reactive stripping agent comprises activated oxygen radicals generated in a microwave plasma.

U.S. Pat. No. 5,057,187 entitled "Ashing Method For Removing An Organic Film On A Substance Of A Semiconductor Device Under Fabrication" granted Oct. 15, 1991 to Keisuke Shinagawa et al. shows a method of removing a resist material by plasma ashing in a plasma comprising $O_2$, $H_2O$ and $N_2$. Alternately the stripping plasma comprises $O_2$, $H_2O$ and $CF_4$ or $O_2$, $H_2$ and $N_2$.

U.S. Pat. No. 6,105,588 entitled "Method Of Resist Stripping During Semiconductor Device Fabrication" granted Aug. 22, 2000 to Li Li et al. describes a method of resist stripping in gaseous plasmas formed in gases or mixtures of gases comprising: 1. $NH_3$; 2. $NH_3$ and $N_2$; 3. $O_2$, $NH_3$, $H_2O$ and $N_2$; or 4. $O_2$, $NH_3$, $H_2O$, $CF_4$ and $N_2$.

The present invention is directed to a novel method of stripping a photoresist mask from the surface of an OSG layer or from the surface of an OSG layer having an etched vertical profile formed therein. The method of the present invention causes stripping of a photoresist mask without attack or damage to the OSG layer or without attack or damage to the sidewalls of the etched vertical profile of structures etched in the OSG layer.

SUMMARY OF THE INVENTION

It is a general object of the present invention to provide an improved method of photoresist stripping for use during fabrication of semiconductor integrated circuits.

A more specific object of the present invention is to provide an improved method of photoresist stripping for use during fabrication of semiconductor integrated circuits, which use porous low-k dielectric materials as the interlevel and intra-level insulating layers.

Another object of the present invention is to provide an improved method of photoresist stripping for use during fabrication of semiconductor integrated circuits, which use porous oxides, such as OSG, as the low-k dielectric material in interlevel and intra-level insulating layers.

In accordance with the present invention, the above and other objectives are realized by using a method of photoresist stripping during semiconductor device fabrication, the method comprising: providing a semiconductor substrate with a photoresist material formed thereon; placing the semi-conductor substrate in a chamber having therein a plasma generating power source; passing a gaseous mixture comprising $NH_3$ and CO through said chamber; applying power to said plasma generating power source to cause ionization of said gaseous mixture; and directing the ionized gas mixture at the semiconductor substrate to cause stripping of said photo-resist material.

In a second embodiment of the present invention, the above and other objectives are realized by using a method of stripping photoresist applied over a layer of low-k dielectric material during semiconductor device fabrication, the method comprising: providing a semiconductor substrate with a photoresist material applied over a layer of low-k dielectric material formed on the semiconductor substrate; placing the semiconductor substrate in a chamber having therein a plasma generating power source; passing a gaseous mixture comprising $NH_3$ and CO through said chamber; applying power to said plasma generating power source to cause ionization of said gaseous mixture; and directing the ionized gas mixture at the semiconductor substrate to cause stripping of said photoresist material applied over said layer of low-k dielectric material.

In yet a third embodiment of the present invention, the above and other objectives are realized by using a method of fabricating a vertically etched structure in a layer of low-k dielectric material applied to a semiconductor substrate, comprising the steps of: providing the semiconductor substrate having a layer of low-k dielectric material applied thereon; applying a patterned layer of photoresist onto said layer of low-k dielectric material; etching said layer of low-k dielectric material to form vertical sidewall trenches and features in said low-k dielectric material; and stripping said patterned layer of photoresist in a plasma generated in a gaseous mixture of $NH_3$ and CO.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of photoresist stripping for use during fabrication of semiconductor integrated circuits, which use porous low-k dielectric materials as the interlevel and intra-level insulating layers will now be described in detail.

Figure 1A:
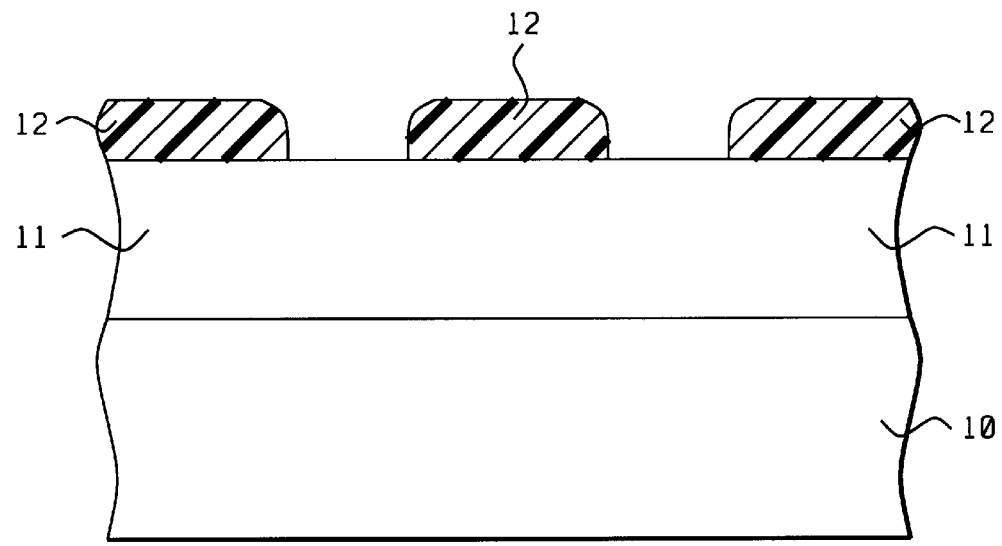
FIGS. 1A–1C, which in cross-sectional representation illustrate the method of one embodiment of the present invention.

Referring to FIG. 1A, a semiconductor substrate 10 has a low-k dielectric layer 11 formed thereon. The low-k dielectric layer 11 may be porous OSG (organic silicate glass) or HSQ (hydrogen silsesquioxane) or other low-k materials. The thickness of the low-k dielectric layer is typically between about 2000 and 8000 Angstroms. A patterned photoresist layer 12 is applied to the surface of low-k dielectric layer 11. Conventional exposure and development means are used to pattern the photoresist layer.

Figure 1B:
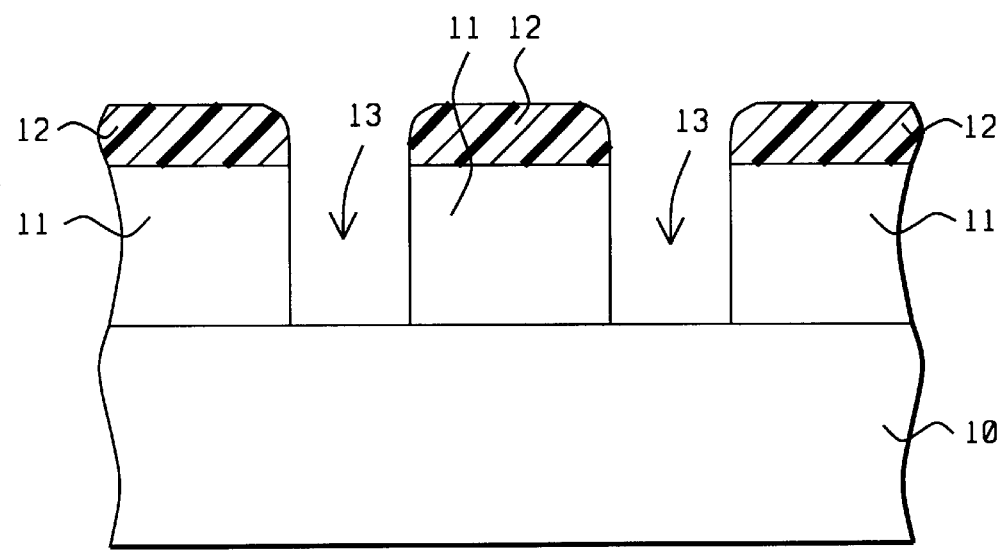
Figure 1C:
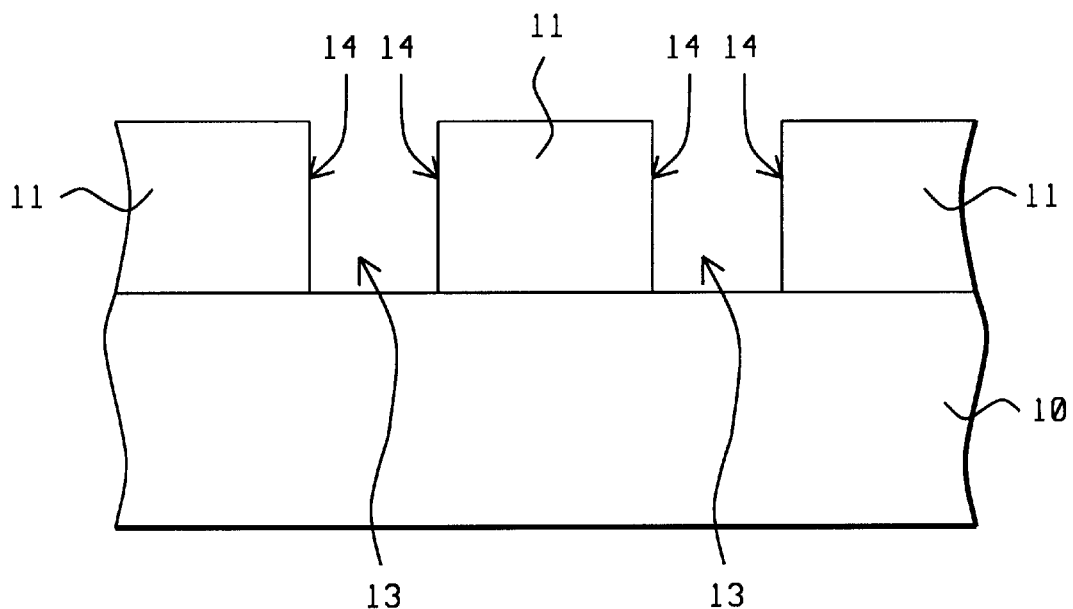
Figure 2:
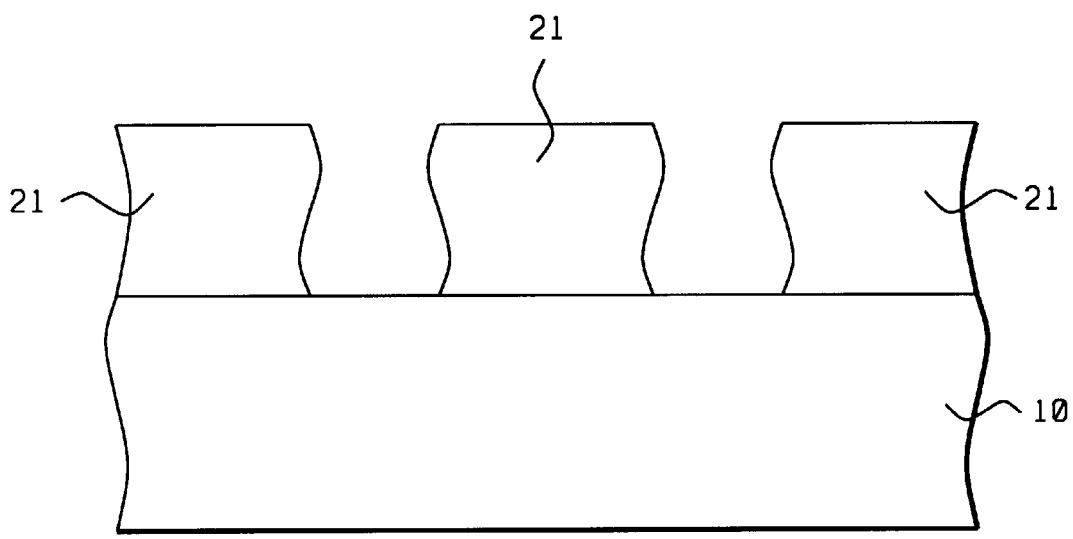
FIG. 2, which in cross-sectional representation illustrates sidewall attack (bowing) which occurs to OSG when $O_2$ containing plasmas are used to strip a photoresist mask from the surface of an OSG layer.

Now referring to FIG. 1B, vertical trenches 13 are etched into the low-k dielectric layer 11, using the patterned photoresist layer 12 to define the regions where etching is prevented. Anisotropic etching of OSG, resulting in vertical sidewalls in OSG, is performed using $C_XF_Y$ based plasmas. Anisotropic etching of HSQ, resulting in vertical sidewalls in HSQ, is performed using $C_XF_Y$ based plasmas. Finally, as depicted in FIG. 1C, the photoresist mask is stripped in a plasma generated in a gaseous mixture of $NH_3$ and CO, resulting in vertical sidewalls 14 remaining in the trenches 13 and features etched into the low-k dielectric layer 11 after stripping of the photoresist mask. The plasma generated in the gaseous mixture of $NH_3$ and CO effectively and efficiently strips the photoresist mask without attacking or damaging the sidewalls of the low-k dielectric material. In the plasma generated in the gaseous mixture of $NH_3$ and CO, $NH_3$ is an effective etchant for photoresist and CO causes growth of a thin passivating polymer layer on the vertical sidewalls of the low-k dielectric layer. This thin passivating layer prevents sidewall attack and damage by the etchant component and prevents "bowing" of the sidewall. FIG. 2 illustrates the sidewall attack of OSG layer 21, resulting in "bowing" of the OSG layer 21, which occurs when the photoresist mask is stripped using conventional $O_2$ containing plasmas. In the present invention the ratio of CO to $NH_3$ in the gaseous mixture is critical for achieving a high rate of stripping of the photoresist mask without attacking the sidewalls of the low-k dielectric material. The desired ratio of CO to $NH_3$ is between about 0.5 and 2.0. And, the best photoresist stripping results are obtained when the ratio of CO to $NH_3$ is between about 0.8 and 1.2. The flow rate of $NH_3$ in the gaseous mixture should be in a range between about 50 and 300 sccm. The flow rate of CO in the gaseous mixture should be in a range between about 50 and 300 sccm. Photoresist stripping takes place in plasmas generated in the gaseous mixture of $NH_3$ and CO by microwave or rf power sources. When using a microwave power source, the applied power should be in the range between about 200 and 2000 Watts. When using an rf power source, the applied power should be in a range between about 200 and 2000 Watts.

While the invention has been particularly shown and described with reference to the preferred embodiments thereof, it will be understood by those skilled in the art that various changes in form and details may be made without departing from the spirit and scope of the invention.

What is claimed is:

1. A method of photoresist stripping during semiconductor device fabrication, the method comprising:
   providing a semiconductor substrate with a photoresist material formed thereon;
   placing the semiconductor substrate in a chamber having therein a plasma generating power source;
   passing a gaseous mixture comprising $NH_3$ and CO, and no $O_2$ through said chamber;
   applying power to said plasma generating power source to cause ionization of said gaseous mixture; and
   directing the ionized gas mixture at the semiconductor substrate to cause stripping of said photoresist material.

2. The method of claim 1, wherein said plasma generating source is a microwave power supply.

3. The method of claim 1, wherein said plasma generating source is an rf power supply.

4. The method of claim 1, wherein the ratio of CO to $NH_3$ is in a range between about 0.5 and 2.0.

5. The method of claim 1, wherein the flow rate of $NH_3$ is in a range between about 50 and 300 sccm.

6. The method of claim 1, wherein the flow rate of CO is in a range between about 50 and 300 sccm.

7. The method of claim 2, wherein the power applied to said microwave power supply is between about 200 and 2000 Watts.

8. The method of claim 3, wherein the power applied to said rf power supply is between about 200 and 2000 Watts.

9. A method of stripping photoresist applied over a layer of low-k dielectric material during semiconductor device fabrication, the method comprising:
   providing a semiconductor substrate with a photoreist material applied over a layer of low-k dielectric material formed on the semiconductor substrate;
   placing the semiconductor substrate in a chamber having therein a plasma generating power source;
   passing a gaseous mixture comprising $NH_3$ and CO, and no $O_2$ through said chamber;
   applying power to said plasma generating power source to cause ionization of said gaseous mixture; and
   directing the ionized gas mixture at the semiconductor substrate to cause stripping of said photoresist material applied over said layer of low-k dielectric material.

10. The method of claim 9, wherein said layer of low-k dielectric material comprises a porous organic glass, such as OSG.

11. The method of claim 9, wherein said layer of low-k dielectric material comprises HSQ.

12. The method of claim 9, wherein said plasma generating source is a microwave power supply.

13. The method of claim 9, wherein said plasma generating source is an rf power supply.

14. The method of claim 9, wherein the ratio of CO to $NH_3$ is in a range between about 0.5 and 2.0.

15. The method of claim 9, wherein the flow rate of $NH_3$ is in a range between about 50 and 300 scam.

16. The method of claim 9, wherein the flow rate of CO is in a range between about 50 and 300 sccm.

17. The method of claim 12, wherein the power applied to said microwave power supply is between about 200 and 2000 Watts.

18. The method of claim 13, wherein the power applied to said rf power supply is between about 200 and 2000 Watts.

19. A method of fabricating a vertically etched structure in a layer of low-k dielectric material applied to a semiconductor substrate comprising the steps of:

providing the semiconductor substrate having a layer of low-k dielectric material applied thereon;

applying a patterned layer of photoresist onto said layer of low-k dielectric material;

etching said layer of low-k dielectric material to form vertical sidewall trenches and features in said low-k dielectric material; and stripping said patterned layer of photoresist in a plasma generated in a gaseous mixture comprising $NH_3$ and CO, and no $O_2$.

20. The method of claim 19, wherein said layer of low-k dielectric material comprises a porous organic glass, such as OSG.

21. The method claim 19, wherein said layer of low-k dielectric material comprises HSQ.

22. The method of claim 19, wherein said plasma is generated by a microwave power source.

23. The method of claim 19, wherein said plasma is generated by an rf power source.

24. The method of claim 22, wherein said microwave power is between about 200 and 2000 Watts.

25. The method of claim 23, wherein said rf power is between about 200 and 2000 Watts.

26. The method of claim 19, wherein in said gaseous mixture of $NH_3$ and CO the ratio of CO to $NH_3$ is in a range between about 0.5 and 2.0.

27. The method of claim 19, wherein the flow rate of $NH_3$ is in a range between about 50 and 300 sccm.

28. The method of claim 19, wherein the flow rate of CO is in a range between about 50 and 300 scam.

* * * * *